United States Patent
Wang et al.

(10) Patent No.: US 11,360,403 B2
(45) Date of Patent: Jun. 14, 2022

(54) BANDWIDTH CALCULATION SYSTEM AND METHOD FOR DETERMINING A DESIRED WAVELENGTH BANDWIDTH FOR A MEASUREMENT BEAM IN A MARK DETECTION SYSTEM

(71) Applicant: ASML Netherlands B.V., Veldhoven (NL)

(72) Inventors: Jia Wang, Eindhoven (NL); Jacob Fredrik Friso Klinkhamer, Tilburg (NL); Hua Li, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/057,619

(22) PCT Filed: May 2, 2019

(86) PCT No.: PCT/EP2019/061174
§ 371 (c)(1),
(2) Date: Nov. 20, 2020

(87) PCT Pub. No.: WO2019/223976
PCT Pub. Date: Nov. 28, 2019

(65) Prior Publication Data
US 2021/0208519 A1    Jul. 8, 2021

(30) Foreign Application Priority Data
May 24, 2018 (EP) .................... 18173977

(51) Int. Cl.
*G03F 7/20* (2006.01)
*G03F 9/00* (2006.01)
(52) U.S. Cl.
CPC .......... *G03F 9/7046* (2013.01); *G03F 9/7065* (2013.01); *G03F 9/7088* (2013.01)

(58) Field of Classification Search
CPC .... G03F 9/7046; G03F 9/7065; G03F 9/7088; G03F 7/70633; G03F 7/70616;
(Continued)

(56) References Cited

U.S. PATENT DOCUMENTS

| 5,324,953 A | 6/1994 | Yoshitake et al. |
|---|---|---|
| 6,952,253 B2 | 10/2005 | Lof et al. |

(Continued)

FOREIGN PATENT DOCUMENTS

| EP | 1 455 235 A2 | 9/2004 |
|---|---|---|
| JP | H05-217846 A | 8/1993 |

(Continued)

OTHER PUBLICATIONS

International Search Report and Written Opinion of the International Searching Authority directed to related International Patent Application No. PCT/EP2019/061174, dated Jun. 18, 2019; 9 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

Disclosed is a bandwidth calculation system for determining a desired wavelength bandwidth for a measurement beam in a mark detection system, the bandwidth calculation system comprising a processing unit configured to determine the desired wavelength bandwidth based on mark geometry information, e.g. comprising mark depth information representing a depth of a mark. In an embodiment the desired wavelength bandwidth is based on a period and/or a variance parameter of a mark detection error function. The invention further relates to a mark detection system, a position measurement system and a lithographic apparatus comprising the bandwidth calculation system, as well as a method for determining a desired wavelength bandwidth.

12 Claims, 7 Drawing Sheets

(58) Field of Classification Search
CPC .. G03F 7/70591; G03F 7/705; G03F 7/70625;
G01B 9/02004; G01B 11/02; G01B
9/02007; G01B 9/02044; G01B 9/02091;
G01B 11/2513; G01B 11/14; G01N
21/956; G01N 21/4788; G01N 21/4795;
G01J 3/02; G01J 1/4257; G01J 9/0246;
G01J 3/26; G01J 3/0229; G01J 3/14;
G01J 3/0208; G01J 3/18; G01J 3/10;
G01J 3/0289; H04B 10/07953; H04B
10/0795; H01S 3/1106; G02F 1/33; G02F
1/0136; G02B 27/4205; G02B 27/4244;
G02B 27/286; G02B 5/1828; G02B
3/0006; G02B 27/1013
See application file for complete search history.

(56) References Cited

U.S. PATENT DOCUMENTS

| 6,961,116 | B2 | 11/2005 | Den Boef et al. |
| 2002/0044586 | A1 | 4/2002 | Myers et al. |
| 2005/0128452 | A1 | 6/2005 | Matsumoto |
| 2006/0001879 | A1 | 1/2006 | Presura et al. |
| 2009/0195768 | A1 | 8/2009 | Bijnen et al. |
| 2010/0245792 | A1 | 9/2010 | Bijnen et al. |
| 2012/0307226 | A1 | 12/2012 | Maeda |
| 2013/0100459 | A1 | 4/2013 | Iwai et al. |
| 2013/0141723 | A1 | 6/2013 | Wei et al. |
| 2015/0049334 | A1 | 2/2015 | Lin et al. |
| 2015/0261097 | A1 | 9/2015 | Mathijssen et al. |
| 2018/0292326 | A1* | 10/2018 | Manassen ........... G03F 7/70633 |

FOREIGN PATENT DOCUMENTS

| JP | H05-226220 A | 9/1993 |
| JP | H08-306602 A | 11/1996 |
| JP | 2003-017406 A | 1/2003 |
| JP | 2005-167139 A | 6/2005 |
| JP | 2007-294749 A | 11/2007 |
| JP | 2013-118369 A | 6/2013 |
| TW | 2005-16227 A | 5/2005 |
| WO | WO 2017/211694 A1 | 12/2017 |
| WO | WO 2018/010979 A1 | 1/2018 |

OTHER PUBLICATIONS

International Preliminary Report on Patentability directed to related International Patent Application No. PCT/EP2019/061174, dated Nov. 24, 2020; 6 pages.

Morgana et al., "Rigorous Wafer Topography Simulation for Investigating Wafer Alignment Quality and Robustness," Proc. of SPIE, vol. 9426, Optical Microlithography XXVIII, Mar. 26, 2015; pp. 1-15.

* cited by examiner

BANDWIDTH CALCULATION SYSTEM AND METHOD FOR DETERMINING A DESIRED WAVELENGTH BANDWIDTH FOR A MEASUREMENT BEAM IN A MARK DETECTION SYSTEM

CROSS REFERENCE TO RELATED APPLICATIONS

This application claims priority of EP application 18173977.2 which was filed on 2018 May 24 and which is incorporated herein in its entirety by reference.

FIELD

The present invention relates to the technical field of mark detection.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on, or in, a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Inaccuracies or errors in the determination of the position of the alignment marks may lead to inaccuracies in the pattern projected on the substrate. In addition an alignment mark may be rejected if no satisfying measurement can be obtained. Too many alignment marks of a single substrate being rejected results in the substrate being rejected, thus slowing down the manufacturing of the substrates and causing yield loss. Recent developments in lithography, such as so-called 3D-NAND processes and Far-Back-End-Of-Line (FBEOL) layers, have led to substrates with a larger stack depth, e.g. having more layers or thicker layers. For these substrates marks with a larger mark depth can occur. It has been found that in particular in substrates with larger mark depths not only more variation in the alignment marks occurs which makes the measurement less predictable, e.g. due to variations in layer thickness and/or mark depth, but also more often the determination of the position of the alignment mark contains errors due to mark deformations. For such substrates the mark depth, mark materials and mark geometry is usually dictated by the process for making the substrate rather than being designed to optimize the alignment process.

WO18010979 A1, incorporated herein by reference, which relates to the measuring of overlay between targets from two layers of a substrate, proposes to select a specific wavelength of a measurement beam to achieve a more robust and reliable measurement.

Nicoló Morgana, et. al, in "Rigorous wafer topography simulation for investigating wafer alignment quality and robustness," Proc. SPIE 9426, Optical Microlithography XXVIII, 94260S (26 Mar. 2015), propose a broadband light measurement beam to reduce the sensitivity of the measurement to process variation when using a contrast method to determine the position of the mark rather than a phase difference method.

SUMMARY

It is an object of the invention to provide an improvement for determining the position of marks.

This object is achieved with a bandwidth calculation system for determining a desired wavelength bandwidth for a measurement beam in a mark detection system, the bandwidth calculation system comprising a processing unit configured to determine the desired wavelength bandwidth based on mark geometry information.

According to the invention the desired wavelength bandwidth for the measurement beam is calculated, taking into account the geometry of the mark. The inventors have found that the mark is determined more accurately by adjusting the wavelength bandwidth of the measurement beam to the geometry of the mark. The mark geometry information may e.g. comprise mark depth information representing a depth of a mark, and/or mark material information representing the material used in the mark or a diffractive index of said material, and/or optical path difference information representing the difference in optical path travelled by different reflected beams comprising a component of the measurement beam reflected by the mark, and/or mark asymmetry information representing the asymmetry of the mark or possible asymmetry of the mark according to tolerances in the manufacturing process of the mark, and/or object information representing the materials and/or thickness and/or number of layers of the mark, in particular above the mark.

In an embodiment the mark geometry information comprises mark depth information representing a depth of a mark. According to this embodiment the desired wavelength bandwidth for the measurement beam is calculated, taking into account the depth of the mark. The inventors have found that the mark is determined more accurately by adjusting the wavelength bandwidth of the measurement beam to the depth of the mark.

In an embodiment the processing unit is configured to determine a period and/or a variance parameter of a mark detection error function, based on said mark depth information, said mark detection error function representing a difference between an actual position of the mark and a determined position of the mark as a function of the wavelength of the measurement beam, and determine the desired wavelength bandwidth based on the period and/or the variance parameter, respectively. Advantageously a mark detection error can be reduced by taking into account these characteristics of the mark detection error function.

In an embodiment the processing unit is configured to determine a reflected light signal strength of a reflected beam comprising a component of the measurement beam, based on said mark geometry information, and determine the desired wavelength bandwidth based on the reflected light signal strength. By selecting an appropriate wavelength bandwidth it can be ensured that substantially all measurements meet a threshold of a sensor of a detector arranged to detect the reflected beam, thereby avoiding mark rejections.

In an embodiment the bandwidth calculation system further comprises an operator information module configured to inform an operator regarding the desired wavelength bandwidth. This allows an operator to arranging the measurement beam accordingly, e.g. by selecting an appropriate radiation source.

In an embodiment the bandwidth calculation system further comprises an input terminal configured to receive the mark geometry information. As such the mark depth information can e.g. be received from an input module or another processing unit of a lithographic process.

In an embodiment the object is a substrate, and the mark depth information represents a distance which the measurement beam is configured to travel from a top surface of the mark to a bottom reflective interface. The invention is in particular advantageous for such applications. In a further embodiment said distance multiplied by a refractive index of a material through which the measurement beam travels from said top surface to the bottom reflective interface is larger than 1 µm. The inventors have found that for such substrates in particular mark detection errors can occur which can be at least reduced with the present invention.

The invention further relates to a mark detection system for detecting a mark which is present on, or in (e.g. covered by one or more layers), an object, comprising the bandwidth calculation system according to the invention, a radiation unit comprising a radiation source holder configured to accommodate a radiation source and a control unit configured to control said radiation source, said radiation source being configured to emit a measurement beam towards the mark comprising radiation in a wavelength bandwidth with a selected width based on the desired wavelength bandwidth. The mark detection system further comprises a detection unit comprising a detector configured to detect a reflected beam comprising a component of the measurement beam being reflected by the mark, and a processing unit configured to determine a position of the mark based on the reflected beam detected by the detector. The invention thus provides in a mark detection system in which the selected width of the wavelength bandwidth of the measurement beam is based on the desired wavelength bandwidth as determined by the bandwidth calculation system. As such the mark detection error is reduced and/or is more predictable.

In an embodiment the mark detection system further comprises the radiation source, wherein the selected width of the wavelength bandwidth of the measurement beam is between 10 and 100 nm, optionally between 15 and 80 nm, e.g. between 20 and 70 nm, e.g. between 20 and 40 nm or between 35 and 55 nm. It has been found that such wavelength bandwidths provide an improvement over conventional radiation sources for substrates presently used.

The invention further relates to a mark detection system for detecting a mark which is present on or in an object, comprising a radiation unit comprising a radiation source holder, a radiation source arranged in the radiation source holder, configured to emit a measurement beam towards the mark comprising radiation in a wavelength bandwidth with a selected width, and a control unit configured to control said radiation source. The mark detection system further comprises a detection unit comprising a detector configured to detect a reflected beam comprising a component of the measurement beam being reflected by the mark, and a processing unit configured to determine a position of the mark based on the reflected beam detected by the detector. The selected width of said wavelength bandwidth is between 10 and 100 nm, optionally between 15 and 80 nm, e.g. between 20 and 70 nm, e.g. between 20 and 40 nm or between 35 and 55 nm. It has been found that such wavelength bandwidths provide an improvement over conventional radiation sources for substrates presently used In an embodiment of one of the mark detection systems according to the invention the radiation source is configured to emit a broadband beam, wherein the radiation unit further comprises a filter arranged in a light path of said broadband beam and configured to convert the broadband beam into the measurement beam, wherein the selected width of the wavelength bandwidth of the measurement beam is smaller than a width of the wavelength bandwidth of the broadband beam. Advantageously the radiation source can be a standard radiation source configured to emit broadband radiation, e.g. white light, and the filter is used to provide the measurement beam with a wavelength bandwidth with a selected width based on the desired width.

In a further embodiment wherein the mark detection system also comprises the bandwidth calculation system, the filter is configured to be adaptable such that the selected width of the wavelength bandwidth of the measurement beam is adaptable, the processing unit of the bandwidth calculation system further is configured to determine an operation setting of the filter based on the desired wavelength bandwidth, and the control unit of the radiation unit is configured to control the filter according to said operation setting. Advantageously a single radiation source, e.g. emitting broadband radiation, can be used for a wide range of measurement beams and thus a wide range of marks.

In an embodiment the mark detection system further comprises a plurality of radiation sources adapted to be arranged in the radiation source holder, wherein each radiation source is configured to emit radiation in a wavelength bandwidth with a different width. As such the most appropriate radiation source can be used.

In an embodiment the radiation unit comprises a plurality of radiation source holders and plurality of radiation sources configured to be arranged therein, each radiation source being configured to emit a measurement beam towards the mark comprising radiation in a wavelength bandwidth comprising a central wavelength, the wavelength bandwidths of plurality of radiation sources comprise different central wavelengths and/or different widths. The processing unit of the bandwidth calculation system is further configured to select one of the plurality of radiation sources based on the desired wavelength bandwidth, and the control unit of radiation unit is configured to control the selected radiation source to emit the measurement beam. As such the most appropriate radiation source can be used.

In an embodiment the processing unit of the detection unit is configured to determine the position of the mark based on a phase difference between the reflected beam and a reference beam. It has been found that the invention is in particular advantageous in such application as the accuracy of the measurement is influenced by the mark depth.

The invention further relates to a position measurement system for determining a position of an object comprising at least one mark, comprising the mark detection system according to the invention configured to detect at least one mark of the object, and a processing unit configured to determine the position of the object based on the at least one mark detected by the mark detection system. The wavelength bandwidth of the measurement beam according to the invention increases the accuracy of the determination of the position.

The invention further relates to a lithographic apparatus comprising: a projection system configured to project a pattern onto a substrate comprising at least one mark, a substrate support configured to hold the substrate, and the position measurement system according to the invention, configured to determine a position of the substrate by determining the position of at least one mark on the substrate. The wavelength bandwidth of the measurement beam according to the invention increases the accuracy of the determination of the position of the substrate.

In an embodiment the lithographic apparatus further comprises a substrate positioning system configured to control movement of the substrate support based on the position of the substrate determined by the position measurement system. The wavelength bandwidth of the measurement beam according to the invention increases the accuracy of the determination of the position of the substrate and as such the movement of the substrate support.

The invention further relates to a method for determining a desired wavelength bandwidth for a measurement beam in a mark detection system, the method comprising determining the desired wavelength bandwidth based on mark geometry information. According to the invention the desired wavelength bandwidth for the measurement beam is calculated, taking into account the geometry of the mark. The inventors have found that the mark is determined more accurately by adjusting the wavelength bandwidth of the measurement beam to the depth of the mark.

In an embodiment the mark geometry information comprises mark depth information representing the depth of the mark. It is in particular advantageous to determine the desired wavelength bandwidth on the depth of the mark.

In an embodiment the method further comprises determining a period and/or a variance parameter of a mark detection error function, based on said mark depth information, said mark detection error function representing a difference between an actual position of the mark and a determined position of the mark as a function of the wavelength of the measurement beam, and determining the desired wavelength bandwidth based on said period and/or said variance parameter, respectively. Advantageously a mark detection error can be reduced by taking into account these characteristics of the mark detection error function.

The invention further relates to a method for detecting a mark which is present on or in an object, comprising: determining a desired wavelength bandwidth for a measurement beam according to the method according to the invention, emitting the measurement beam towards the mark, wherein the measurement beam comprises radiation in a wavelength bandwidth with a selected width based on the desired wavelength bandwidth. The method further comprises detecting a reflected beam comprising a component of the measurement beam being reflected by the mark, and determining the position of the mark based on said reflected beam. By arranging the selected width of the wavelength bandwidth of the measurement beam based on the desired wavelength bandwidth as determined by the bandwidth calculation system, the mark detection error is reduced and/or is more predictable.

The invention further relates to a method for detecting a mark on or in a substrate, comprising determining a desired wavelength bandwidth for a measurement beam according to the method according to the invention, emitting the measurement beam towards the mark, wherein the measurement beam comprises radiation in a wavelength bandwidth with a selected width based on the desired wavelength bandwidth, wherein the measurement beam is configured to travel a distance from a top surface of the mark to a bottom reflective interface, said distance being represented by the mark depth information, optionally said distance multiplied by a refractive index of a material through which the measurement beam travels being larger than 1 μm. The method further comprises detecting a reflected beam comprising a component of the measurement beam being reflected by the mark, and determining the position of the mark based on said reflected beam. By arranging the selected width of the wavelength bandwidth of the measurement beam based on the desired wavelength bandwidth as determined by the bandwidth calculation system, the mark detection error is reduced and/or is more predictable.

In an embodiment the method for detecting a mark on or in an object or the method for detecting a mark on or in a substrate further comprises: determining an operation setting of a filter based on the desired wavelength bandwidth, wherein said filter arranged in a light path of a broadband beam and configured to convert the broadband beam into the measurement beam, wherein the selected width of the wavelength bandwidth of the measurement beam is smaller than a width of the wavelength bandwidth of the broadband beam. The method further comprises controlling the filter according to said operation setting. Advantageously the radiation source can be a standard radiation source configured to emit broadband radiation, e.g. white light, and the filter is used to provide the measurement beam with a wavelength bandwidth with a selected width based on the desired width.

In an embodiment the method for detecting a mark on or in an object or the method for detecting a mark on or in a substrate further comprises: selecting one of a plurality of radiation sources to emit the measurement beam with, based on the desired wavelength bandwidth, wherein the wavelength bandwidths of the plurality of radiation sources comprise different widths. As such the most appropriate radiation source is used to emit the measurement beam with the wavelength bandwidth having the selected width.

BRIEF DESCRIPTION OF THE DRAWINGS

Embodiments of the invention will now be described, by way of example only, with reference to the accompanying schematic drawings wherein like reference numerals indicate like features, in which:

FIG. 5b depicts a 3σ standard deviation of the mark detection error functions shown in FIG. 5a;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). Radiation used for a measurement beam, e.g. in an alignment sensors, may e.g. comprise radiation with a wavelength of 850 nm or more.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
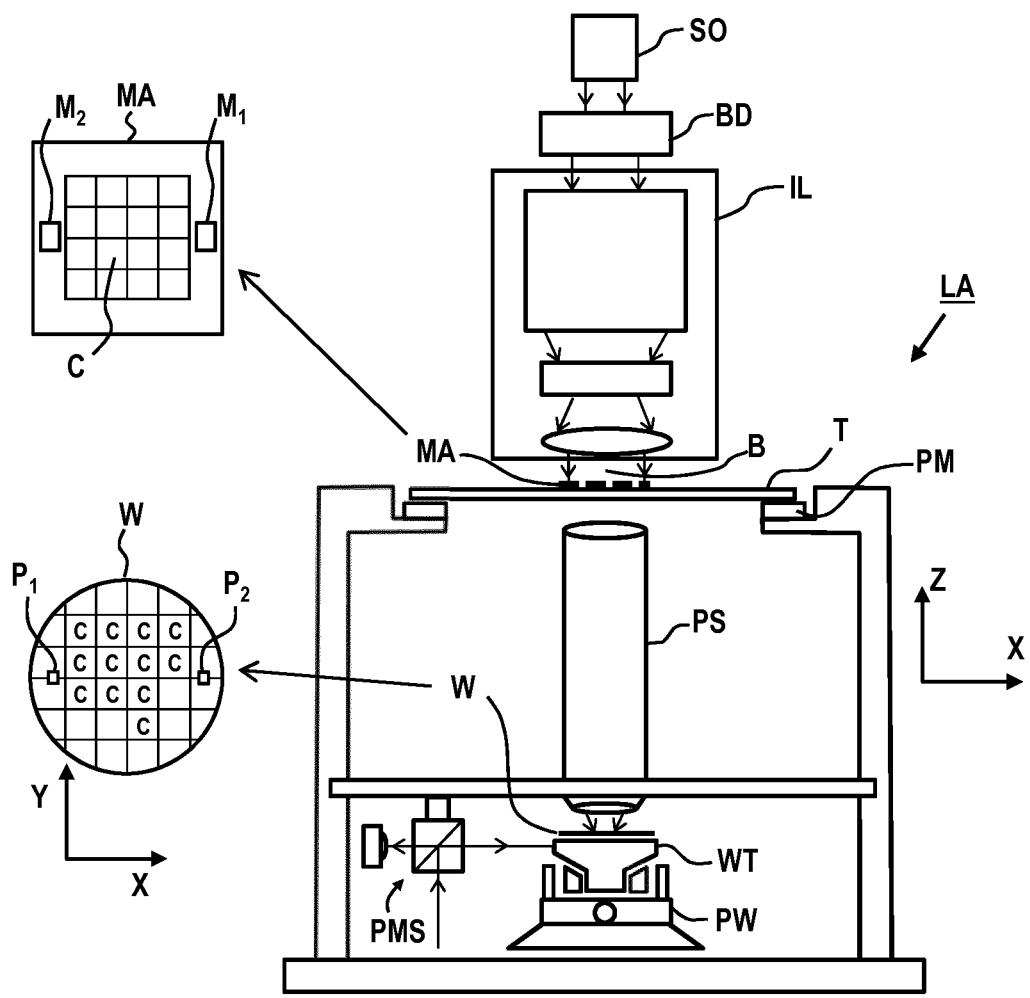
FIG. 1 depicts a schematic overview of a lithographic apparatus.

FIG. 1 schematically depicts a lithographic apparatus LA, which may e.g. be embodied according to the invention and/or comprises a bandwidth calculation system, mark detection system and/or position measurement system according to the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
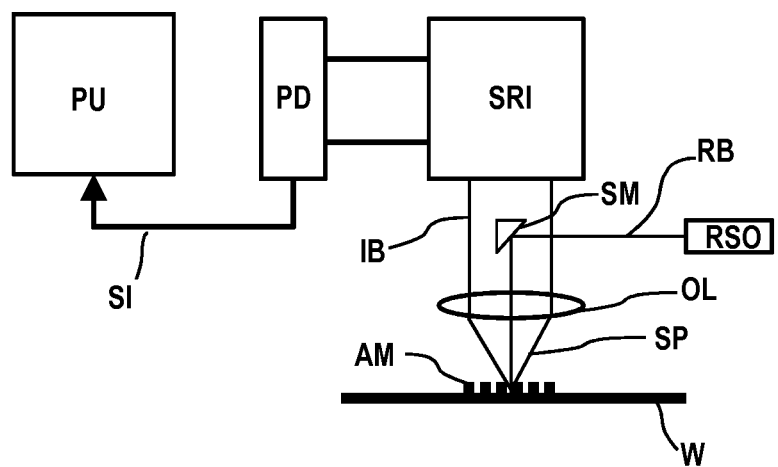
FIG. 2 is a schematic block diagram of an embodiment of a known alignment sensor.

FIG. 2 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths in a narrow bandwidth, e.g. with a width of 5 nm or less, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g.

relative to a frame to which the alignment system is connected). A measurement of the position of the alignment marks provided on the substrate allows the position of the substrate relative to the substrate support to be determined.

Figure 3A:
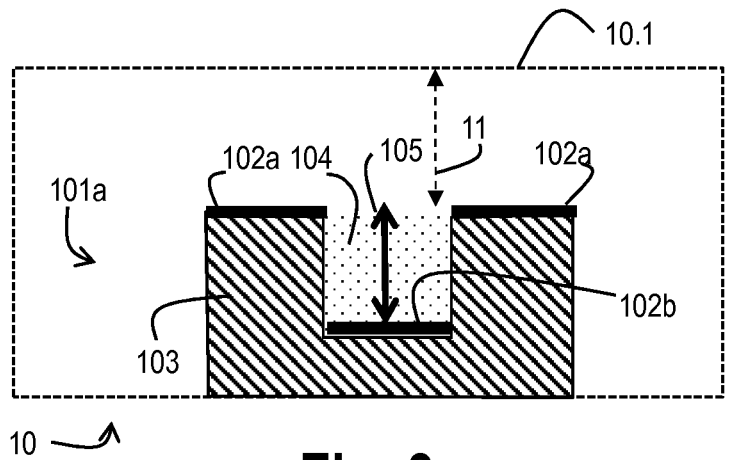
FIGS. 3a-3d depict possible embodiments of marks.
Figure 3B:
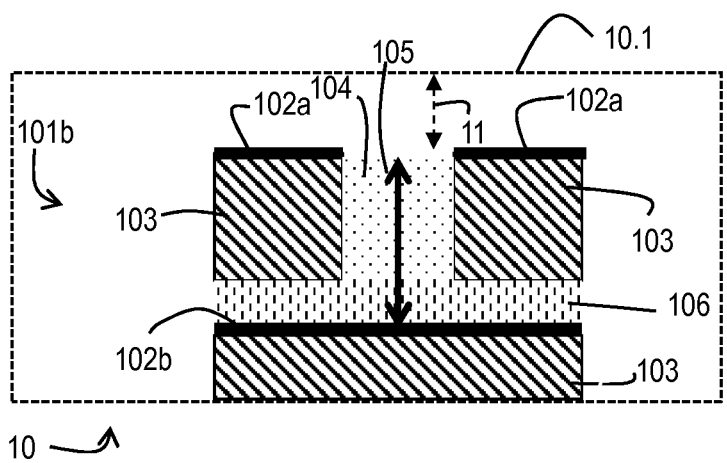
Figure 3C:
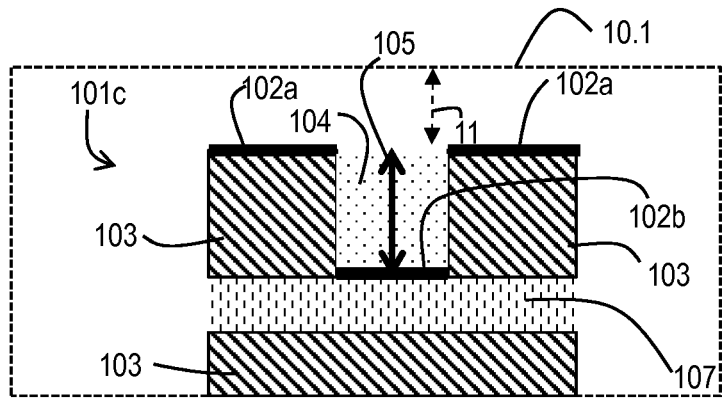

FIGS. 3a, 3b and 3c each show a possible embodiment of a mark 101a, 101b, 101c, respectively, which is present on an object 10, which is schematically shown. It is noted however that numerous embodiments are possible for the marks, which may e.g. be an alignment mark AM as shown in FIG. 2. In the examples in FIG. 3a-3c the mark 101a, 101b, 101c comprises opaque material 103 and a first transparent material 104. Mark 101b further comprises a second transparent material 106 and mark 101c comprises a third transparent material. Reflective interfaces 102a are further provided on a top surface of the mark 101a, 101b, 101c, while another reflective interface 102b defines a bottom reflective interface. The reflective interfaces 102a, 102b are e.g. formed by a large refractive index difference between material above it and the material below it. A measurement beam (not shown) which is emitted onto the mark 101a, 101b, 101c will partly be reflected by the reflective interfaces 102a on the top surface and partly by the reflective interfaces 102b on the bottom reflective interface, resulting in different reflected beams each comprising components of the measurement beam reflected on the mark 101a, 101b, 101c. It is noted that in practice reflection may occur from all materials; the reflective interfaces 102a, 102b indicated in the figures however cause the dominating reflected beams. It is further noted that in the context of the present invention reflection is intended to include diffraction and the reflective beams are intended to include diffracted beams. Conventionally the measurement beam is emitted by a radiation source such as laser, and comprises radiation in a narrow wavelength bandwidth, e.g. with a width of 5 nm or less.

The mark 101a, 101b, 101c functions as a phase grating, causing a phase change in the reflected beams by which the position of the mark 101a, 101b, 101c can be determined. Based on the geometry of the mark 101a, 101b, 101c and the refractive indices of the applied materials, a mark depth can be defined as a distance between the top surface and bottom reflective interface. An optical path difference 105 can be defined representing the difference in optical path length travelled by the different reflected beams. Said optical path difference 105 can e.g. be defined as the mark depth multiplied by a refractive index of the material through which the beam travels, e.g. of the transparent material 104. In the case of the mark 101b where the beam also travels through the second transparent material the optical path difference is the sum of distances traveled in each material multiplied by the respective refractive index.

Figure 3D:
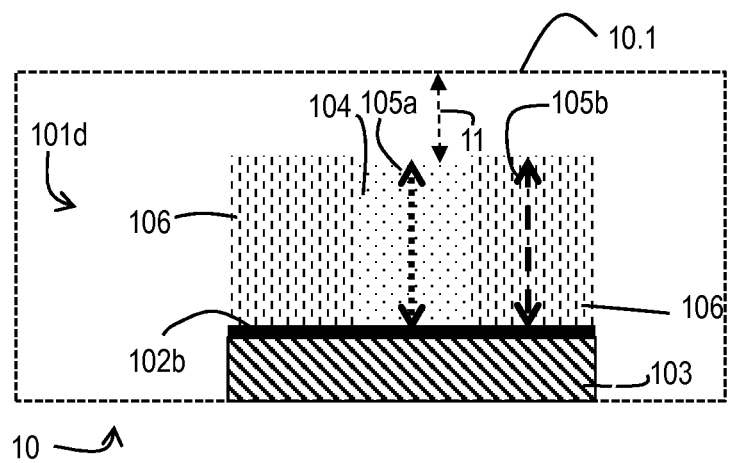
Figure 3E:
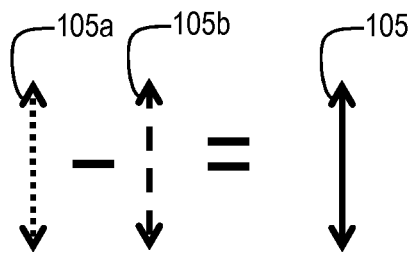
FIG. 3e illustrates an optical path difference in the mark shown in FIG. 3d.

FIG. 3d shows another possible embodiment of a mark 101d. In this embodiment a single reflective interface 102b is provided as a bottom reflective interface. Above the reflective interface 102 and under a top surface of the mark, i.e. substantially equal to the mark depth as seen vertically in FIG. 3d, there is provided the first transparent material 104 and the second transparent material 106, which have different refractive indexes. An optical path 105a through the first transparent material 105a can be defined as a distance traveled through said first transparent material 105a multiplied by the refractive index of said first transparent material 105a, and an optical path 105b through the second transparent material 105b can be defined as a distance traveled through said second transparent material 105b multiplied by the refractive index of said second transparent material 105b. As is indicated by FIG. 3e, the optical path difference 105 can be defined as the difference between the optical path 105a and the optical path 105b.

It is noted that although in FIG. 3a-3d the arrows 105, 105a, 105b represent the optical path 105, the mark depth also corresponds with the distance indicated by these arrows 105, 105a, 105b.

The optical path difference 105 between the different reflected beams of the measurement beam allows a detector to generate a mark detection signal, e.g. based on a phase difference between said reflections when they reach a sensor of the detector arranged to detect said reflected beams, e.g. the photodetector PD in FIG. 2. However, if the optical path difference 105 is equal to a wavelength of the measurement beam it may not be able to differentiate the reflected beam reflected by reflective interface 102b from the reflected beam reflected by reflective interface 102a, thereby resulting in a mark detection error. The mark detection error is thus dependent on the wavelength of the measurement beam.

The mark detection error is further influenced by the geometry of the mark and mark deformation, e.g. mark asymmetry. This may e.g. include tilt of a top surface of the mark, differences in shape or tilt between two sidewalls of the mark, tilt of a bottom surface of the mark, and/or material inhomogeneity. Such mark deformations affect the measurement beam and the reflected beams and as such the mark detection error. This effect becomes more relevant as the mark depth increases.

Figure 4A:
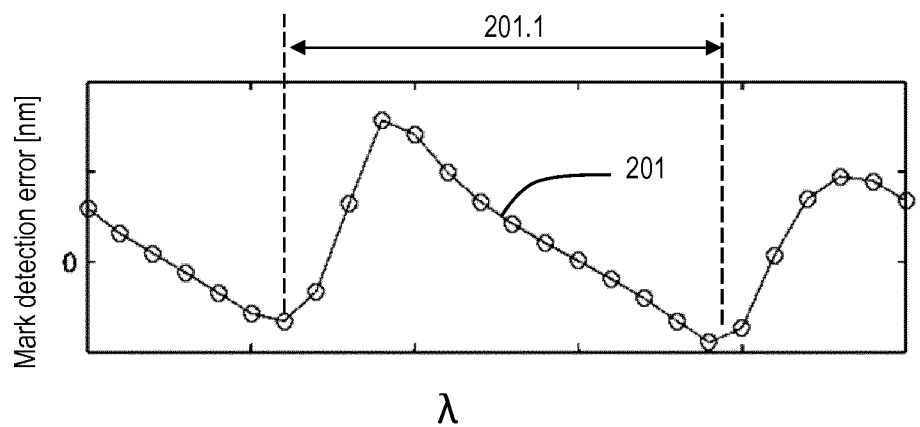
FIG. 4a illustrates a mark detection error as a function of the wavelength of the measurement beam.

FIG. 4a illustrates a mark detection error function 201 for an arbitrary mark and an arbitrary detector. Said mark detection error function 201 represents a mark detection error which is defined as a difference between an actual position of the mark and a determined position of the mark as a function of the wavelength λ of the measurement beam. Said determined position for any wavelength λ is defined as the position of the mark which the detector would determine if the measurement beam would mainly comprise radiation of said wavelength λ.

The mark detection error function 201 has an approximately periodic shape as a function of the wavelength λ of the measurement beam. A period 201.1 thereof is dependent on the optical path difference, and the length thereof can approximately be determined, e.g. by using the following formula:

$$\text{Length of Period} \approx \frac{\lambda^2}{\text{Optical path difference} - \lambda} \quad (1)$$

Figure 4B:
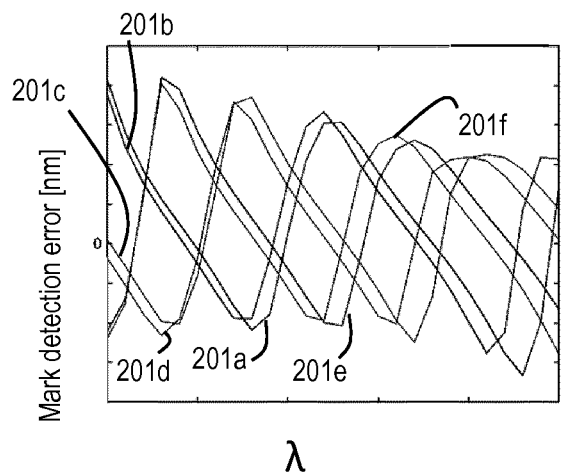
FIG. 4b depicts six different mark detection error functions for marks with similar shape but different depths each representing a mark detection error as a function of the wavelength of the measurement beam.

FIG. 4b for example shows six different mark detection error functions 201a-201f for marks with the same mark asymmetry but different mark depths, and thus different optical path differences, within the manufacturing tolerances of said marks. In the shown example mark depth variations are within +−5% of the nominal value. As can be seen the periodic shape of the mark detection error functions 201a-201f as a function of the wavelength λ have been shifted relative to each other. In addition as the mark depth increases the length of the period decreases, since the optical path difference in formula (1) above increases.

Figure 4C:
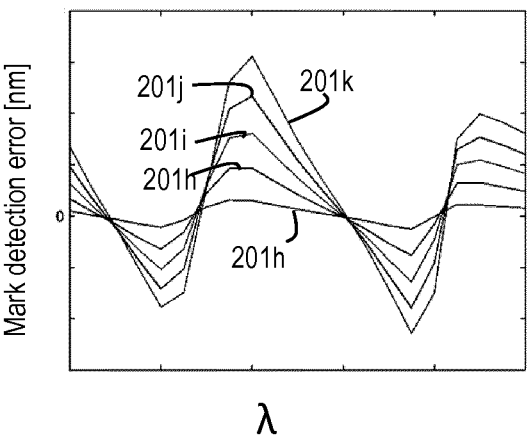
FIG. 4c depicts five different mark detection error functions for marks with similar shapes but increasing asymmetry each representing a mark detection error as a function of the wavelength of the measurement beam.

The mark detection error function 201, sometimes also referred to as swing curve, is further dependent on other factors, such as the manufacturing errors of the mark. FIG. 4c shows five different mark detection error functions 201g-201k for marks with the same mark depth, but increasing asymmetry within the manufacturing tolerances of said marks. The phase difference between the different reflected beams increases as the asymmetry increases and therefore results in mark detection errors. Said asymmetry can e.g. result from specific processing tools or technology limitations which lead to inaccuracies in the manufacturing process of the mark, which may e.g. comprises steps such as etching and/or deposition. The asymmetry e.g. comprise tilt of the mark and/or tilted sidewalls, which in the shown example are both within a range of +−1%. FIG. 4c illustrates that the maximal amplitude of the mark detection error functions 201g-201k increase as the asymmetry increases; however the length of the periodic shape as a function of the wavelength $\lambda$ remains substantially the same.

Figure 4D:
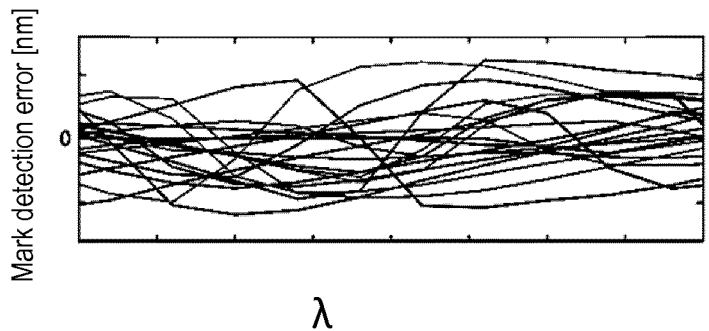
FIG. 4d depicts an example of a number of mark detection error functions which may arise from the marks on or in a single substrate.

In practice the marks on (or in) a substrate may differ from each other within the manufacturing tolerances, e.g. combinations of different mark depth variation and mark asymmetry variation, resulting in a wide variety of mark detection error functions. FIG. 4d shows an example of a number of mark detection error functions which may arise from the marks on, or in, a single substrate. As can be seen the mark detection error for any wavelength $\lambda$ of the measurement beam can vary significantly, not only resulting in larger errors, but also making the errors unpredictable.

Furthermore, the mark may be rejected if no satisfying measurement can be obtained. This may for example be a consequence of the mark detection error being too large, the reflected beam not having sufficient radiation intensity, or the detector not being able to detect a periodic wave, e.g. a sine wave, in the detected reflected beam. In practice the substrate may comprise a plurality of marks, e.g. up to seventy marks. Although in some embodiments not all marks need to be detected to accurately determine the position of the substrate, when too many marks are rejected, the substrate itself may be rejected, e.g. because its position cannot be accurately determined. The substrate must then be removed from the lithographic machine, resulting is loss of time and decrease of yield.

In FIG. 3a-3d the marks 101a, 101b, 101c, 101d are provided on the object 10, e.g. a substrate. The object 10 extends a distance 11 above the top surface of the mark 101a, 101b, 101c, 101d. Said distance 11 may e.g. increase as more layers are provided on the object 10, e.g. if the object 10 is a substrate. If said layers are deposited flat and uniform, the effect on the measurement beam and the reflected beams is limited. However, if e.g. the mark 101a, 101b 101c, 101d has a surface topology to which the layers above are subjected, this may lead to distortions in the measurement beam and/or the reflected beams, causing variation in the mark detection error and/or the reflected light signal strength.

The inventors have found that the mark detection can be improved by increasing the wavelength bandwidth of the measurement beam. By including radiation of more wavelengths in said wavelength bandwidth, the mark detection error can be evened out.

Figure 5A:
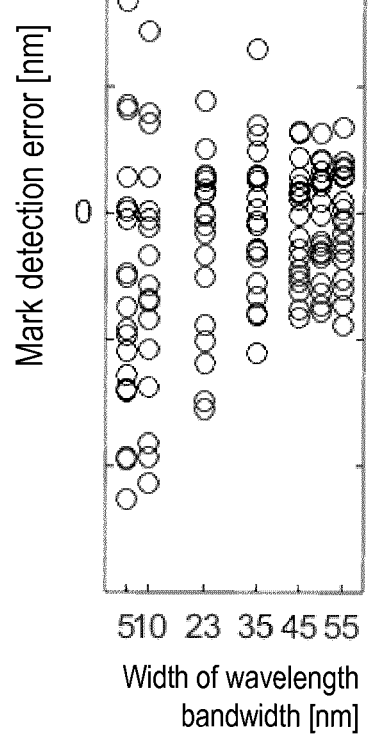
FIG. 5a depicts an example of possible values of mark detection errors functions as a function the width of the wavelength bandwidth of the measurement beam.
Figure 5B:
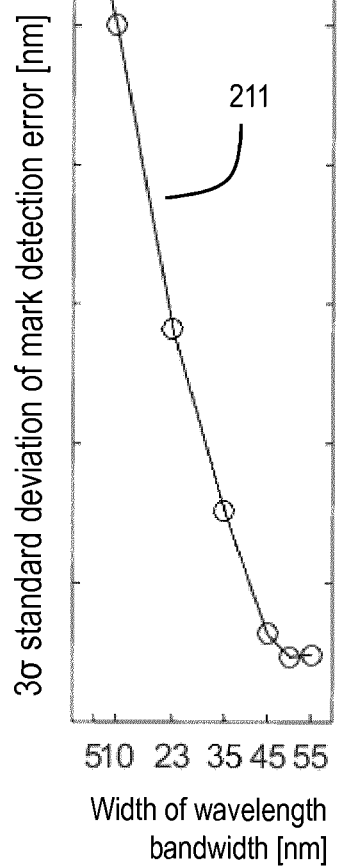

FIG. 5a shows an example of possible values mark detection errors functions as a function of the width of the wavelength bandwidth of the measurement beam (5, 10, 23, 35, 45 and 55 nm) for 100 marks in a representative object, e.g. a substrate, each with a randomly generated combination of mark depth and mark asymmetry within their manufacturing tolerances. FIG. 5b shows a 3σ standard deviation 211 of those mark detection error functions as a function of the width of the wavelength bandwidth (5, 10, 23, 35, 45 and 55 nm). The 3σ standard deviation 211 is representative of the possible variations of the mark detection error function within three times the standard deviation σ from the main value of the mark detection error function, including 99.7% of the possible mark detection errors. FIG. 5b shows that said 3σ standard deviation 211 initially decreases steeply as the width of the wavelength bandwidth increases until it substantially stabilizes, which in the shown example occurs at a wavelength bandwidth of approximately 45-50 nm.

Figure 5C:
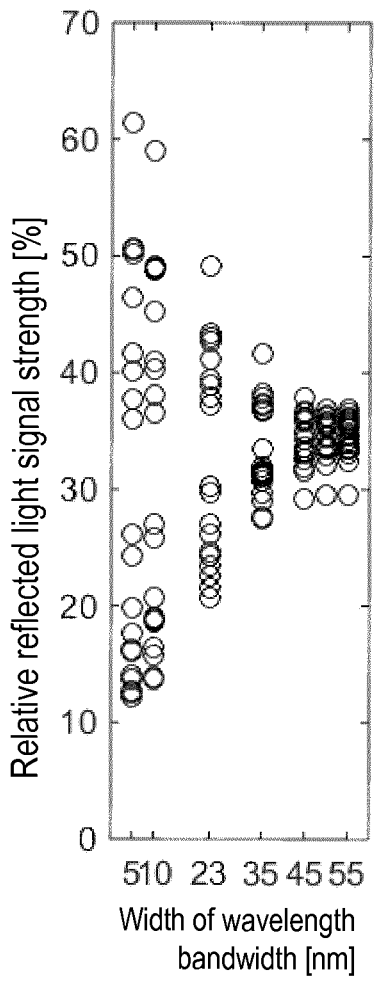
FIG. 5c depicts an example of possible values of a reflected light signal strength as a function of the width of the wavelength bandwidth of the measurement beam

FIG. 5c shows an example of possible values of a reflected light signal strength as a function of the width of the wavelength bandwidth of the measurement beam (5, 10, 23, 35, 45 and 55 nm) for the same 100 marks as depicted in FIG. 5a, expressed as a percentage compared to a reference mark. The reflected light signal strength represents the strength of a signal generated by the detector based on a reflected beam detected by said detector, and comprising radiation of the measurement beam reflected by the mark. The reflected light signal strength is dependent on the wavelength of the measurement beam, on the mark, in particular the mark depth, and on the object itself, e.g. the layers above the mark. The reflected light signal strength should be above a threshold which is dependent on the detector detecting the reflected beam, in particular the sensor of the detector, in order to correctly detect said reflected beam and avoid the particular mark being rejected. FIG. 5c shows that, similarly to the mark detection error function, the possible values of the reflected light signal strength converge as the width of the wavelength bandwidth of the measurement beam increases. For example, if the threshold for the used sensor is 25% in the example of FIG. 5c, a measurement with a narrow wavelength bandwidth would include many marks which cannot be correctly detected by the sensor. From a wavelength bandwidth with a width of approximately 35 nm however, substantially all marks have a reflected light signal strength that meets the threshold.

The inventors have further found that the width of the wavelength bandwidth at which the 3σ standard deviation stabilizes is approximately equal to the length of the period of the mark detection error function, which can e.g. be determined using equation (1) above. It is therefore advantageous to select a width of the wavelength bandwidth of the measurement beam to be approximately equal to said length or more.

It is further noted that the width of the wavelength bandwidth of the measurement beam is preferably limited. A broader wavelength bandwidth entails more noise in the signal and may be disadvantageous for the sensor detecting the reflected beam, e.g. by increasing a sensor error which may e.g. include lens aberrations. It is therefore not preferred that the measurement beam emitted onto the mark comprises broadband radiation such as white light.

Figure 6:
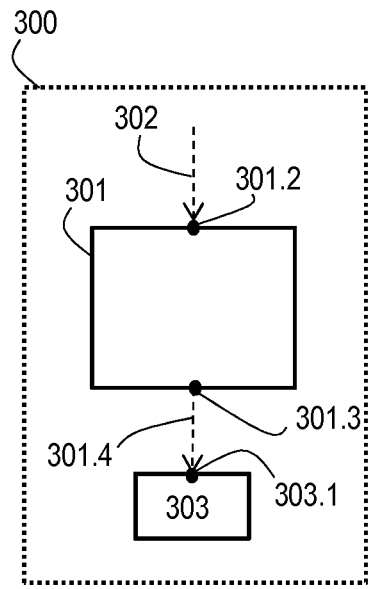
FIG. 6 depicts a bandwidth calculation system according to the invention.

FIG. 6 depicts a bandwidth calculation system 300 according to the invention for determining a desired wavelength bandwidth for a measurement beam in a mark detection system. The bandwidth calculation system 300 comprises a processing unit 301 configured to determine the desired wavelength bandwidth based on mark geometry information.

The mark geometry information 302 may e.g. comprise mark depth information representing a depth of a mark, and/or mark material information representing the material used in the mark or the refractive index of said material, and/or optical path difference information representing the difference in optical path travelled by different reflected beams comprising a component of the measurement beam reflected by the mark, and/or mark asymmetry information representing the asymmetry of the mark or possible asymmetry of the mark according to tolerances in the manufacturing process of the mark, and/or object information representing the materials and/or thickness and/or number of layers of the mark, in particular above the mark. Since all of these parameter influence the mark detection error, as explained above, said mark detection error or at least the predictability of it can be reduced by determining a desired wavelength bandwidth based on any of these parameters.

In a preferred embodiment the mark geometry information 302 comprises at least mark depth information 302. Since the mark detection error is dependent on the width of the wavelength bandwidth of the measurement beam and the mark depth, the invention provides a solution for reducing the mark detection error by determining a desired wavelength bandwidth.

In an embodiment the processing unit 301 is configured to determine a period of a mark detection error function, based on said mark depth information 302, and determine the desired wavelength bandwidth based on the period.

For example, the processing unit 301 may apply formula (1) above to determine the period. For example, a selected width of said desired wavelength bandwidth may be approximately equal to said length of said period, e.g. the selected width of said desired wavelength bandwidth being in a range of +−20% of the length of said period, e.g. in a range of +−10% of the length of said period. As explained above, the inventors have found that the mark detection error decreases significantly with such wavelength bandwidth.

In an embodiment the processing unit is configured to determine a variance parameter of a mark detection error function, based on said mark depth information 302, and determine the desired wavelength bandwidth based on the variance parameter. The variance parameter may e.g. be the standard deviation σ or three times the standard deviation σ, i.e. the 3σ standard deviation. As explained above, by decreasing said variance parameter by selecting an appropriate wavelength bandwidth the maximal possible mark detection error is decreased.

In an embodiment the processing unit is configured to determine a reflected light signal strength of a reflected beam comprising a component of the measurement beam, based on said mark geometry information 302 and/or mark depth information 302, and determine the desired wavelength bandwidth based on the reflected light signal strength. As explained above, by selecting an appropriate wavelength bandwidth it can be ensured that substantially all measurements meet a threshold of the sensor of the detector, thereby avoiding mark rejections.

In an embodiment the bandwidth calculation system 300 comprises an input terminal 301.2 configured to receive the mark geometry information 302. Said input terminal 301.2 may e.g. be connected, wired or wireless, to an input module via which input information regarding the mark, e.g. regarding the shape, manufacturing process, and/or manufacturing of the object, can be provided, from which e.g. the mark depth information is derived. Said input information may e.g. be provided by an operator or automatically, e.g. via a connection to a database. The input terminal 301.2 can also be connected to one or more processing units of other parts of a lithographic process, e.g. providing information regarding measurements performed on the object and/or regarding the object itself, e.g. regarding the number and/or shape of layers on the object when the object is a substrate.

It is noted that although in the shown embodiment the processing unit 301.2 receives the mark depth information 302 via the input terminal 301.2, it is also possible that the processing unit 301 determines that mark depth information 302 and/or the optical path difference information, and/or the mark asymmetry information, and/or object information itself, e.g. based on data received via the input terminal 301.2.

In an embodiment the bandwidth calculation system 300 comprises an operator information module 303 configured to inform an operator regarding the desired wavelength bandwidth. In the shown example the processing unit 301 comprises an output terminal 301.3 for sending a desired wavelength bandwidth signal 301.4 to an input terminal 303.1 of the operator information module 303. The operator information module 303 may e.g. comprise a visual representation module, e.g. a screen, e.g. of a computer-like device, on which the desired wavelength bandwidth can be represented. Based on the desired wavelength bandwidth the operator e.g. can select an appropriate radiation source to emit the measurement beam with, or select an appropriate setting for a filter which determines the wavelength bandwidth of the measurement beam. It is noted that the operator information module 303 may also provide other functions, e.g. for other parts of a lithographic process.

In an embodiment the object is a substrate, and the mark depth information represents a distance which the measurement beam is configured to travel from a top surface of the mark to a bottom reflective interface, e.g. as has been explained with reference in FIG. 3a-3e. In a further embodiment said distance multiplied by a refractive index of a material through which the measurement beam travels is larger than 1 µm, thus e.g. the optical path difference being larger than 1 µm. It has been found that in particular for such marks the invention is advantageous, as mark detection errors increase for increasing mark depth.

Figure 7:
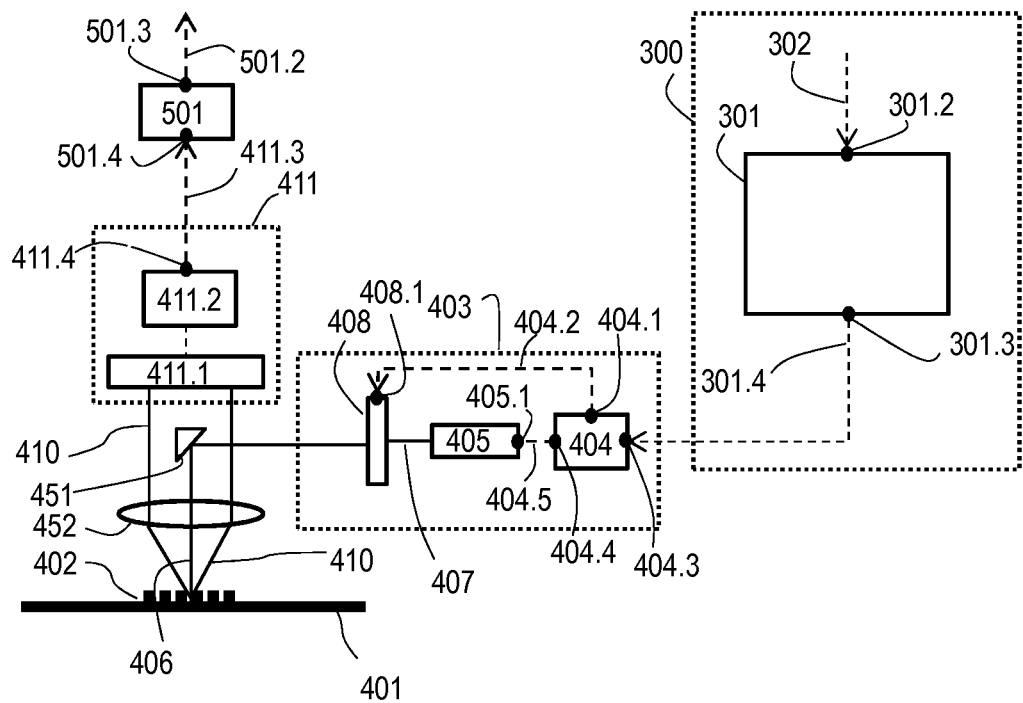
FIG. 7 depicts a mark detection system and a position measurement system according to the invention.

FIG. 7 schematically depicts a mark detection system according to the invention for detecting a mark 402 which is present on, or in, an object 401, comprising a bandwidth calculation system 300 according to the invention. The mark detection system further comprises a radiation unit 403 comprising a radiation source holder (not shown) configured to accommodate a radiation source 405 and a control unit 404 configured to control said radiation source 405. The radiation source 405 is configured to emit a measurement beam 406 towards the mark 402 comprising radiation in a wavelength bandwidth with a selected width based on the desired wavelength bandwidth. The mark detection system further comprises a detection unit 411 comprising a detector 411.1 configured to detect a reflected beam 410 comprising a component of the measurement beam 406 being reflected by the mark 402, and a processing unit 411.2 configured to determine a position of the mark 402 based on the reflected beam 410 detected by the detector 411.1.

The invention thus provides in a mark detection system in which the selected width of the wavelength bandwidth of the measurement beam 406 is based on the desired wavelength bandwidth as determined by the bandwidth calculation system 300. As such the mark detection error is reduced and/or is more predictable.

In the shown embodiment the control unit 404 of the radiation unit 403 comprises an input terminal 404.3 for receiving the desired wavelength bandwidth signal 301.4 from the output terminal 301.3 of the processing unit 301 of the bandwidth calculation system 300. The control unit 404 further comprises an output terminal 404.4 for sending a control signal 404.5 to an input terminal 405.1 of the radiation source 405. However, other arrangements are possible.

In an embodiment the mark detection system further comprises the radiation source, and the selected width of the wavelength bandwidth of the measurement beam is between 10 and 100 nm, optionally between 15 and 80 nm, e.g. between 20 and 70 nm, e.g. between 20 and 40 nm or between 35 and 55 nm. It has been found that such wavelength bandwidths provide an improvement over conventional radiation sources for substrates presently used. It is noted that usually the wavelength bandwidth of the measurement beam comprises a central wavelength around which the rest of the radiation is provided, e.g. according to a Gaussian curve, e.g. wherein the bandwidth is determined according to Full width at half maximum (FWHM) method, i.e. wherein the width of bandwidth is given by the difference between the two wavelength values at which the emitted energy or light intensity is equal to half of its maximum value, which e.g. occurs and the central wavelength. However other arrangements are also possible, e.g. wherein the emitted energy for all wavelengths within the wavelength bandwidth is substantially equal and outside the wavelength bandwidth substantially zero, e.g. using a filter.

In the shown embodiment the radiation unit 403 comprises an optional filter 408. In this embodiment the radiation source 405 is configured to emit a broadband beam 407. The filter 408 is arranged in a light path of said broadband beam 407 and configured to convert the broadband beam 407 into the measurement beam 406. The selected width of the wavelength bandwidth of the measurement beam 406 is smaller than a width of the wavelength bandwidth of the broadband beam 407. Advantageously the radiation source 405 can be a standard radiation source configured to emit broadband radiation, e.g. white light, and the filter 408 is used to provide the measurement beam 406 with a wavelength bandwidth with a selected width based on the desired width.

In a further embodiment the filter 408 is configured to be adaptable such that the selected width of the wavelength bandwidth of the measurement beam 406 is adaptable. The processing unit 301 of the bandwidth calculation system 300 is configured to determine an operation setting of the filter 408 based on the desired wavelength bandwidth, and the control unit 404 of the radiation unit 403 is configured to control the filter 408 according to said operation setting. In this embodiment the selected width of the wavelength bandwidth is controlled by controlling the filter 408 based on the desired wavelength bandwidth. Advantageously a single radiation source 405, e.g. emitting broadband radiation, can be used for a wide range of measurement beams and thus a wide range of marks 406. In the shown embodiment control unit 404 comprises an output terminal 404.1 for sending a control signal 404.2 to an input terminal 408.1 of the filter 408. Optionally the processing unit 301 is also configured to determine a desired central wavelength for the measurement beam 406, based on which the control unit is configured to control the filter 408.

In an embodiment the mark detection system comprises a plurality of radiation sources 405 adapted to be arranged in the radiation source holder, wherein each radiation source 405 is configured to emit radiation in a wavelength bandwidth with a different width. In this embodiment the most appropriate of the plurality of radiation sources 405 can be selected, e.g. based on the desired wavelength bandwidth, arranged in the radiation source holder and used to emit the measurement beam 406. For example, an operator, e.g. informed by the operator information module, can select one of the plurality of radiation sources 405 to be arranged in the radiation source holder based on the desired wavelength bandwidth. For example, the plurality of radiation sources, e.g. four, five, six or more radiation sources, may be arranged to emit radiation in a wavelength bandwidth with a width between 10 and 100 nm, optionally between 15 and 80 nm, e.g. between 20 and 70 nm, e.g. between 20 and 40 nm or between 35 and 55 nm. Another one of the plurality of radiation sources 405 may e.g. be selected and arranged in the radiation source holder when the mark detection system is arranged to detect marks with a different mark depth.

In an embodiment the radiation unit 403 comprises a plurality of radiation source holders and plurality of radiation sources 405 configured to be arranged therein, each radiation source 405 being configured to emit a measurement beam 406 towards the mark 402 comprising radiation in a wavelength bandwidth comprising a central wavelength. The wavelength bandwidths of plurality of radiation sources 405 comprise different central wavelengths and/or different widths and the processing unit 301 of the bandwidth calculation system 300 is configured to select one of the plurality of radiation sources 4045 based on the desired wavelength bandwidth. The control unit 404 of radiation unit 403 is configured to control the selected radiation source 405 to emit the measurement beam 406. Advantageously based on the desired wavelength bandwidth the appropriate radiation source 405 can be selected. Since the radiation sources 405 are already arranged in the radiation source holders it is not required to perform calibrations each time another one of the plurality of radiation sources is selected. It is noted that is possible to only emit radiation with the selected radiation source 405. However it is also possible to emit radiation with more or all of the plurality of radiation sources 405 at the same time, e.g. the respective wavelength bandwidth being non-overlapping, wherein the detection unit 411 is arranged to only use the reflected beams 410 comprising components of the measurement beam 406 of the selected radiation source 405 to determine the position of the mark 402. Preferably the radiation sources 405 are arranged in the radiation unit 403 such the measurement beam 406 follows the same light path irrespective of which radiation source 405 is selected, e.g. by using optical components such as mirrors. In embodiment the plurality of radiation sources comprise four radiation sources, e.g. emitting green, red, near-infrared and far infrared light. It is noted that this embodiment can be used in combination with the filter 408 or without the filter 408. It is also possible to provide an individual filter 408 for each light source 405.

In an embodiment the radiation unit 403 is configured to emit radiation of green light, e.g. a corresponding central wavelength being substantially equal to 532 nm, and/or red light, e.g. a corresponding central wavelength being substantially equal to 634 nm, and/or near-infrared light, e.g. a corresponding central wavelength being substantially equal to 776 nm, and/or far-infrared light, e.g. a corresponding central wavelength being substantially equal to 836 nm.

In an embodiment the detector 411.1 may comprises one or more sensors (not shown), e.g. photodetectors, for detecting the reflected beam 410. In an embodiment the processing unit 411.2 of the detection unit 411 is configured to determine the position of the mark 402 based on a phase difference between the reflected beam 410 and a reference beam. For example, the detection unit 411 may be provided with a self-referencing interferometer SRI as the one shown in FIG. 2. In an embodiment the processing unit 411.2 of the detection unit 411 is configured to determine the position of the mark 402 based on a phase difference between reflected beams 410 of positive and negative orders, said reflected beams 410 comprising a component of the measurement beam 406 reflected or diffracted on the mark 402. It is noted that the reflected beams 410 of positive and negative orders may also be referred to as diffracted beams of positive and negative orders.

The mark detection unit shown in FIG. 7 further comprises diverting optics including a spot mirror 451 and an objective lens OL, which function similar as the spot mirror SM and the objective lens OL shown in FIG. 2.

It is noted that although the bandwidth calculation system 300 shown in FIG. 7 does not comprise the operator information module, it is also possible to provide this in combination with the connection between the processing unit 301 of the bandwidth calculation system and the control unit 404 of the radiation unit 403, e.g. by providing the processing unit 301 with a second output terminal. Furthermore it is also possible to provide the operator information module without the connection between the processing unit 301 of the bandwidth calculation system and the control unit 404 of the radiation unit 403. For example, an operator may then select an appropriate radiation source 405 or setting of the filter 408 based on the desired wavelength bandwidth.

The invention further relates to a mark detection system without the bandwidth calculation system, but comprising a radiation source 405 arranged in the radiation source holder, configured to emit a measurement beam 406 towards the mark 402 comprising radiation in a wavelength bandwidth with a selected width, wherein the selected width of said wavelength bandwidth is between 10 and 100 nm, optionally between 15 and 80 nm, e.g. between 20 and 70 nm, e.g. between 20 and 40 nm or between 35 and 55 nm. It has been found that such wavelength bandwidths provide an improvement over conventional radiation sources for substrates presently used. Of course, further improvement can be obtained by determining the desired wavelength bandwidth for the specific object 401 and selecting a wavelength bandwidth closer to said desired wavelength bandwidth.

FIG. 7 further shows a position measurement system according to the invention for determining a position of an object 401 comprising at least one mark 402. The position measurement system comprises the mark detection system according to the invention and a processing unit 501 configured to determine the position of the object 401 based on the at least one mark 402 detected by the mark detection system.

In the shown embodiment the processing unit 411.2 of the detection unit 411 comprises an output terminal 411.4 for sending a mark detection signal 411.3 to an input terminal 501.4 of the processing unit 501 of the position measurement system. It is noted however that the processing unit 501 of the position measurement system and the processing unit 411.2 of the detection unit 411 may be incorporated as a single processing unit.

The invention further relates to a lithographic apparatus LA as is e.g. shown in FIG. 1. The lithographic apparatus LA according to the invention comprises a projection system PS configured to project a pattern onto a substrate W comprising at least one mark, a substrate support WT configured to hold the substrate W, and the position measurement system according to the invention, configured to determine a position of the substrate W by determining the position of at least one mark on the substrate W.

In a further embodiment the lithographic apparatus LA comprises a substrate positioning system configured to control movement of the substrate support WT based on the position of the substrate W determined by the position measurement system.

It is noted a single processing unit or other unit may fulfil the functions of several items recited in the description and claims, e.g. of processing units or control units. Similarly the functions as described by a single item, e.g. processing unit or control unit, recited in the description and claims may in practice be fulfilled by multiple components, e.g. multiple processing units or control units. Any communication between features can be wired or wireless according to known methods.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A bandwidth calculation system for determining a desired wavelength bandwidth for a measurement beam in a mark detection system, the bandwidth calculation system comprising:

a processing unit configured to:
  determine the desired wavelength bandwidth based on mark geometry information, wherein the mark geometry information comprises mark depth information representing a depth of a mark,
  determine a period and/or a variance parameter of a mark detection error function, based on the mark depth information, the mark detection error function representing a difference between an actual position of the mark and a determined position of the mark as a function of a wavelength of the measurement beam, and
  determine the desired wavelength bandwidth based on the period and/or the variance parameter, respectively.

2. The bandwidth calculation system of claim 1, wherein the processing unit is configured to:
  determine a reflected light signal strength of a reflected beam comprising a component of the measurement beam, based on a mark geometry information, and
  determine the desired wavelength bandwidth based on the reflected light signal strength.

3. The bandwidth calculation system of claim 1, wherein:
  the object is a substrate, and
  the mark depth information represents a distance which the measurement beam is configured to travel from a top surface of the mark to a bottom reflective interface.

4. The bandwidth calculation system of claim 3, wherein a distance multiplied by a refractive index of a material through which the measurement beam travels from a top surface to the bottom reflective interface is larger than 1 µm.

5. A mark detection system for detecting a mark which is present on or in an object, comprising:
  a bandwidth calculation system configured to determine a desired wavelength bandwidth for a measurement beam in a mark detection system, the bandwidth calculation system comprising a processing unit configured to determine the desired wavelength bandwidth based on mark geometry information;
  a radiation unit comprising a radiation source holder configured to accommodate a radiation source and a control unit configured to control the radiation source, the radiation source being configured to emit a measurement beam towards the mark comprising radiation in a wavelength bandwidth with a selected width based on the desired wavelength bandwidth; and
  a detection unit comprising:
    a detector configured to detect a reflected beam comprising a component of the measurement beam being reflected by the mark, and
    a processing unit configured to determine a position of the mark based on the reflected beam detected by the detector.

6. The mark detection system of claim 5, wherein the selected width of the wavelength bandwidth of the measurement beam is between 10 and 100 nm, between 15 and 80 nm, between 20 and 70 nm, between 20 and 40 nm or between 35 and 55 nm.

7. A mark detection system for detecting a mark which is present on or in an object, comprising:
  a radiation unit comprising:
    a radiation source holder,
    a radiation source arranged in the radiation source holder, configured to emit a measurement beam towards the mark comprising the radiation in a wavelength bandwidth with a selected width, and
    a control unit configured to control the radiation source;
  a detection unit comprising:
    a detector configured to detect a reflected beam comprising a component of the measurement beam being reflected by the mark; and
    a processing unit configured to:
      determine a position of the mark based on the reflected beam detected by the detector, wherein the mark geometry information comprises mark depth information representing a depth of a mark,
      determine a period and/or a variance parameter of a mark detection error function, based on the mark depth information, the mark detection error function representing a difference between an actual position of the mark and a determined position of the mark as a function of a wavelength of the measurement beam, and
      determine the desired wavelength bandwidth based on the period and/or the variance parameter, respectively,
  wherein the selected width of the wavelength bandwidth is between 10 and 100 nm, between 15 and 80 nm, between 20 and 70 nm, between 20 and 40 nm or between 35 and 55 nm.

8. The mark detection system of claim 7, wherein:
  the radiation unit comprises a plurality of radiation source holders and a plurality of radiation sources configured to be arranged therein, each radiation source being configured to emit a measurement beam towards the mark comprising radiation in a wavelength bandwidth comprising a central wavelength,
  the wavelength bandwidths of the plurality of radiation sources comprise different central wavelengths and/or different widths,
  the processing unit of the bandwidth calculation system further is configured to select one of the plurality of radiation sources based on the desired wavelength bandwidth, and
  the control unit of the radiation unit is configured to control the selected radiation source to emit the measurement beam.

9. The mark detection system of claim 7, wherein the processing unit of the detection unit is configured to determine the position of the mark based on a phase difference between the reflected beam and a reference beam or a phase difference between reflected beams of positive and negative orders.

10. A method for determining a desired wavelength bandwidth for a measurement beam in a mark detection system, the method comprising:
  determining the desired wavelength bandwidth based on mark geometry information, wherein the mark geometry information comprises mark depth information representing a depth of a mark;
  determining a period and/or a variance parameter of a mark detection error function, based on the mark depth information, the mark detection error function representing a difference between an actual position of the mark and a determined position of the mark as a function of a wavelength of the measurement beam; and
  determining the desired wavelength bandwidth based on the period and/or the variance parameter, respectively.

11. The method of claim 10, further comprising:
  determining a period and/or a variance parameter of a mark detection error function, based on the mark depth information, the mark detection error function representing a difference between an actual position of the mark and a determined position of the mark as a function of a wavelength of the measurement beam, and determining the desired wavelength bandwidth based on the period and/or the variance parameter, respectively.

12. A system comprising:

a processing unit configured to:
- determine mark geometry information comprising mark depth information representing a depth of a mark;
- determine a reflected light signal strength of a reflected beam comprising a component of a measurement beam based on the mark geometry information; and
- determine a desired wavelength bandwidth based on the reflected light signal strength.

* * * * *